United States Patent
Hertweck

(10) Patent No.: US 7,921,903 B2
(45) Date of Patent: Apr. 12, 2011

(54) HEAT EXCHANGE SYSTEM

(76) Inventor: Jürgen Hertweck, Pfinztal (DE)

( * ) Notice: Subject to any disclaimer, the term of this patent is extended or adjusted under 35 U.S.C. 154(b) by 715 days.

(21) Appl. No.: 11/631,548

(22) PCT Filed: Jul. 8, 2005

(86) PCT No.: PCT/DE2005/001217
§ 371 (c)(1),
(2), (4) Date: Jan. 4, 2007

(87) PCT Pub. No.: WO2006/005325
PCT Pub. Date: Jan. 19, 2006

(65) Prior Publication Data
US 2009/0038781 A1      Feb. 12, 2009

(30) Foreign Application Priority Data

Jul. 8, 2004   (DE) .................. 10 2004 033 063

(51) Int. Cl.
*F28D 15/00*   (2006.01)
(52) U.S. Cl. .................. 165/104.33; 165/80.4; 165/80.5
(58) Field of Classification Search .............. 165/80.4, 165/80.5, 104.19, 104.31, 104.33, DIG. 73, 165/DIG. 72, DIG. 74, DIG. 75
See application file for complete search history.

(56) References Cited

U.S. PATENT DOCUMENTS

| 3,494,415 | A | * | 2/1970 | McNabney ................. 165/85 |
| 3,866,424 | A | * | 2/1975 | Busey ................. 165/104.21 |
| 6,019,165 | A | * | 2/2000 | Batchelder .................. 165/80.3 |
| 6,327,145 | B1 | | 12/2001 | Lian et al. |
| 6,600,649 | B1 | | 7/2003 | Tsai et al. |
| 6,714,412 | B1 | * | 3/2004 | Chu et al. ................... 165/80.4 |
| 2003/0209343 | A1 | | 11/2003 | Bingler |
| 2004/0123614 | A1 | | 7/2004 | Stewart |
| 2006/0032625 | A1 | | 2/2006 | Angelis et al. |

FOREIGN PATENT DOCUMENTS

DE   103 44 699 A1   4/2004
EP   0 582 217 A      2/1994

OTHER PUBLICATIONS

International Search Report.

* cited by examiner

*Primary Examiner* — Teresa J Walberg
(74) *Attorney, Agent, or Firm* — Collard & Roe, P.C.

(57) ABSTRACT

A heat exchange system for electronic devices, preferably data processing devices which include high-performance processors or have a high processor density, includes essentially a primary cooling circuit and a secondary cooling circuit both being thermally associated to the one or more processor units. The secondary cooling circuit is configured as a completely closed system, the coolant in the secondary cooling circuit being driven exclusively by mechanical or inductive coupling with the flow drive of the primary cooling circuit.

14 Claims, 1 Drawing Sheet

HEAT EXCHANGE SYSTEM

CROSS REFERENCE TO RELATED APPLICATIONS

Figure 1:
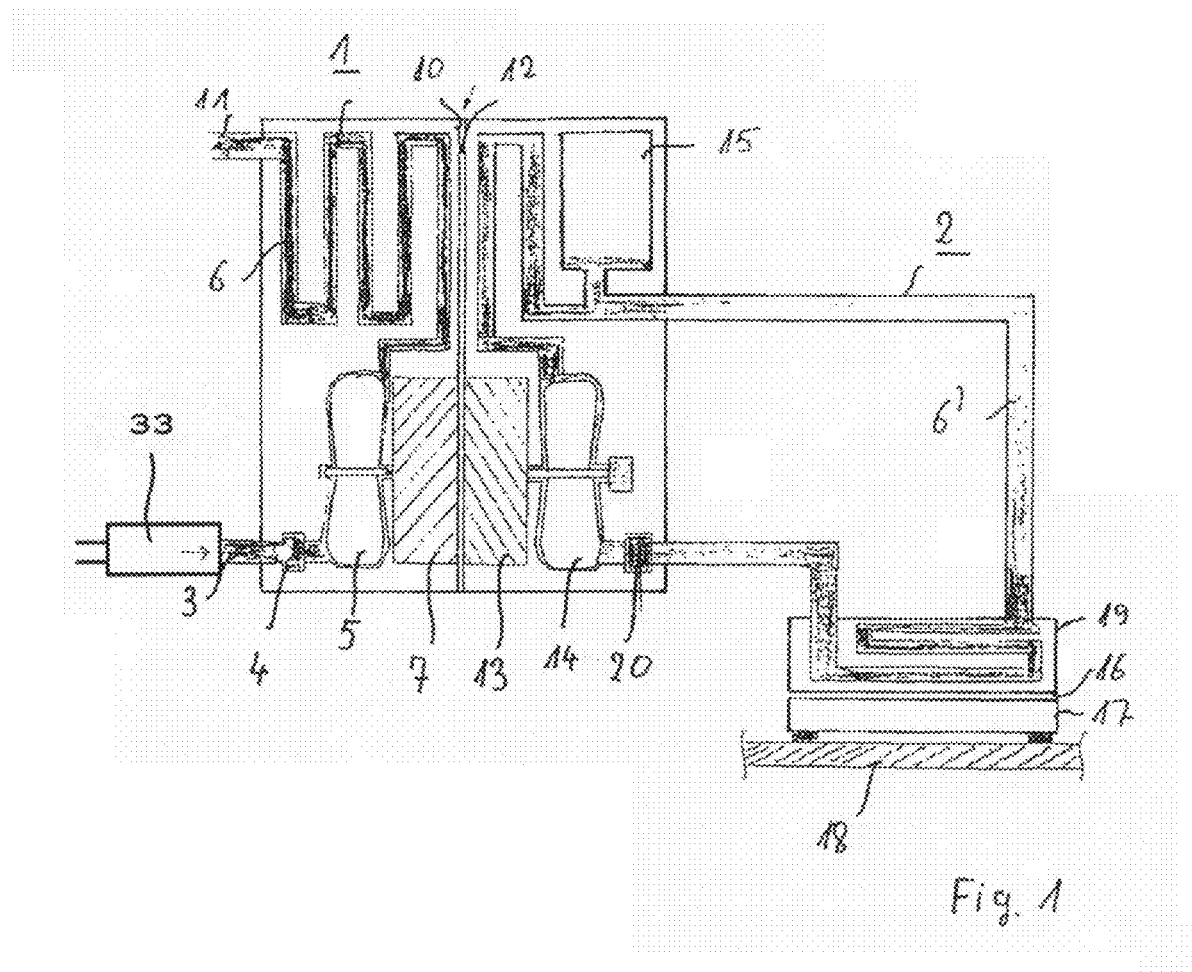

Applicant claims priority under 35 U.S.C. §119 of German Application No. 10 2004 033 063.8 filed Jul. 8, 2004. Applicant also claims priority under 35 U.S.C. §365 of PCT/DE2005/001217 filed Jul. 8, 2005. The international application under PCT article 21(2) was not published in English.

The invention relates to a heat exchange system for electronic devices, preferably data processing devices, having high-performance processors or having a high processor density, having at least one primary cooling circuit and at least one secondary cooling circuit, which are thermally coupled in such a manner that the heat absorbed by the secondary cooling circuit, preferably waste processor heat, is/are given off to the primary cooling circuit(s) by way of heat exchange by way of a contact surface, at least to a great extent, and is/are carried away and/or cooled off by means of the primary cooling circuit(s).

Such a liquid cooling system for so-called "racks" has recently become available on the market from the Rittal company, under the name "PCS—Power Cooling System." This is a liquid-cooled system having a primary and a secondary circuit, whereby a mini re-cooling system, by way of water feed with appropriate connection technology, in other words, in particular, by way of a drip-free quick-closure coupling, and a corresponding cooling circuit distributor for connecting several cooling circuits, are connected with a single cooling system. Here, too, it is possible to speak about a primary cooling circuit, or at least about an inflow and a return flow.

Furthermore, it is known from the U.S. Pat. No. 6,600,649 B1 to switch a liquid cooling system in which the liquid is driven with a multi-chamber pump, and an air cooling circuit having a cooling element to which a fan is assigned, thermally one behind the other. In this connection, the pump drive and the fan drive are disposed on a common shaft. The pump rotors of the chamber are inductively coupled in such a manner that it is sufficient to drive one of the two pump chambers. An electric motor is provided as the drive.

Because of the current trend of disposing larger and larger processor outputs in smaller and smaller spaces, such as in connection with the aforementioned "rack servers," for example, the need for cooling in this sector has risen dramatically, in such a manner that the air flow cooling that has predominantly been used in this sector until now has reached its limits. In the case of modern processors, up to 70 W/cm$^2$ have to be cooled off at present. This is a heat output that corresponds to several stove plates, so that convection cooling, which has been usual until now, is limited if only due to the limited heat absorption capacity of air. For this purpose, faster and more powerful fans have to be used, whereby because of the increased flow velocity of the air, but also because of the fans themselves, a significant noise development is unavoidable. Furthermore, such fan elements are considered to be susceptible to breakdown.

For this reason, liquid cooling systems are increasingly being used, at least in the professional sector of high-performance computers, whose significant advantage consists, in particular, of the heat absorption capacity of the coolants used, which is greater by several powers of ten than that of air.

The systems currently available on the market work essentially with a primary cooling circuit and a secondary cooling circuit, whereby the secondary cooling circuit is assigned to the actual rack, and there absorbs the heat to be conducted away by way of the primary cooling circuit. The drive for the coolant disposed in the circuits is generally situated in the primary cooling circuit or inflow. This drive is generally disposed centrally outside of the rack, so that there is the fundamental problem of introducing the coolant into a rack or a chassis. This is done primarily with liquid-sealed hose connectors, which are structured to be more or less drip-proof. It is understood that the operation of such systems is relatively complicated and that a rapid exchange of processor inserts, in particular, is made more difficult by this. Furthermore, it must be assumed that the coolants are predominantly toxic or at least environmentally harmful, so that the acceptance of these systems must still be designated as being relatively low up to the present.

Proceeding from this state of the art, the invention is based on the task of creating a greatly simplified and more customer-friendly heat exchange system for electronic devices, particularly data processing devices, having high-performance processors or having high processor density.

This task is accomplished by means of a heat exchange system in accordance with the invention. Advantageous embodiments are discussed below.

According to the invention, the primary cooling circuit and the secondary cooling circuit are thermally coupled with one another, but the drive of the cooling in the secondary cooling circuit is brought about exclusively by means of magnetic or mechanical coupling. This has the significant advantage that the secondary cooling circuit can be configured as a completely closed system, independent of the primary cooling circuit. The two cooling circuits are therefore completely separate, in terms of flow technology, and can therefore be sealed separately. In the case of inductive coupling, the two systems are actually configured to be completely closed. In the case of mechanical coupling, only the location where the energy for the flow drive of the secondary cooling circuit is coupled in mechanically has to be sealed, for example with a shaft seal. In both cases, there is the advantage that the flow drive for both cooling circuits, with its moving parts, which might therefore have to be maintained or repaired, is not disposed in the secondary cooling circuit, and therefore outside of the actual data processing device, in most cases. This is particularly important because the use of cooling fluids in the data processing units, which are extremely sensitive to fluids, is still considered to be a significant risk. The displacement of parts that must be maintained, with the proviso that the cooling system might have to be opened in the region of these parts, towards the outside therefore represents a safety advantage as compared with previously known systems that cannot be underestimated.

Doing without an active flow drive in the secondary cooling circuit furthermore represents a significant cost saving. Furthermore, in this manner the secondary cooling circuits can be connected in fixed manner with the processor units to be cooled, and inserted with them in the form of insertion elements, if necessary, and removed from the rack again, if necessary.

According to an embodiment, the secondary cooling circuit is designed as a completely closed system without its own flow drive. The secondary cooling circuit therefore does not require any connectors for the coolant circulating in the secondary cooling circuit, nor does it require its own electrical supply, for example to drive the coolant to be transported in the cooling circuit.

According to a further embodiment as already mentioned, the secondary cooling circuit is configured as a separate insertion element or as an integral part of an insert or one or more processor unit(s) for a rack.

In a concrete embodiment, a primary turbine driven by the flow drive of the primary cooling circuit, with its coupling element, is disposed in the primary cooling circuit, whereby magnetic coupling with the secondary cooling circuit takes place, by means of the aforementioned coupling element, in such a manner that the flow energy required for flow drive of the coolant circulating in the secondary cooling circuit is coupled in in this manner.

In a concrete embodiment, this can be a magnet driven by the primary turbine disposed in the primary cooling circuit, which drives another magnet, preferably one having the same construction, which is disposed in the secondary cooling circuit, whereby the magnet driven in this manner then drives a secondary turbine disposed in the secondary cooling circuit, which allows the coolant disposed in the secondary cooling circuit to circulate as intended.

In an alternative embodiment, the primary turbine disposed in the primary cooling circuit can itself also be configured to be magnetic, in order to thereby drive the secondary turbine disposed in the secondary cooling circuit, which is preferably designed with the same construction, and thereby to create direct magnetic coupling between primary turbine in the primary cooling circuit and secondary turbine in the secondary cooling circuit. In this case, as well, the flow drive of the coolant in the secondary cooling circuit is implemented by way of a magnetic coupling with the primary cooling circuit.

In an alternative embodiment, the flow drive of the secondary cooling circuit can also take place on the basis of a mechanical coupling by way of a conventional gear mechanism. For this purpose, the secondary turbine driven in the secondary cooling circuit is connected to interact with a drive shaft of the primary turbine that is disposed in the primary cooling circuit, by way of a power take-off shaft.

In a further improved embodiment, pressure regulators or at least pressure reducers are disposed in the primary and/or secondary cooling circuit, in order to be able to balance out pressure variations that occur as the result of voltage variations, if necessary, or in order to assure effective over-pressure protection for the subsequent primary or secondary cooling circuit, respectively. Since the heat absorption capacity of the coolant disposed in the cooling circuits depends, among other things, also on the pressure that prevails in the cooling circuit, the stated regulators furthermore represent a setting element for regulating the cooling circuit, also from a thermal aspect.

Alternatively or in addition, one or both of the stated circuits can also have a speed of rotation regulator assigned to it, which acts on the primary turbine or on the secondary turbine, respectively. Finally, these regulators also represent setting elements for regulating the pressure economy, and therefore the thermal economy of the cooling circuits.

The efficiency of the cooling circuit depends very essentially on the heat transfer from the secondary cooling circuit to the primary cooling circuit, whereby it has proven to be advantageous if at least one of the two contact surfaces is configured to be elastic, in order to thereby achieve the most perfect possible contact in the region of these contact surfaces, for the purpose of improved heat transfer.

This can be achieved in simple manner, for example, in that one of the two contact surfaces is produced as a die-cast aluminum part.

The heat transfer in this region can be further improved in that a heat conducting paste subsequently introduced in this region or already introduced in the factory is interposed between the contact surfaces.

Furthermore, at least one equalization container can additionally be disposed in the primary and/or secondary cooling circuit, in each instance, in order to avoid possible excess pressure. The equalization container represents a passive safety element that is practical at least if the installation space permits such an equalization container.

The coolant of the secondary cooling circuit flows through a cooling body assigned to the processor, which gives off the waste heat of the processor to the cooling body and the coolant by way of a heat exchange surface. In this connection, the cooling output of the cooling body can be increased in that the surface of the cooling body that faces away from the heat exchange surface is made larger by means of appropriate bores.

It is advantageous if the cooling body itself is produced from sintered copper.

In the following, the invention will be explained in greater detail, using an exemplary embodiment merely shown schematically in the drawing.

The drawing shows:

FIG. 1: a heat exchange system in a fundamental diagram.

According to the fundamental diagram shown in FIG. 1, the heat exchange system consists of a primary cooling circuit 1 and a secondary cooling circuit 2, which are structured with essentially the same construction. The primary cooling circuit 1 essentially consists of an inflow 3 that reaches a primary turbine 5 with the interposition of a pressure reducer 4, which turbine is driven by the cooling fluid 6 situated in the primary cooling circuit 1. The actual flow drive of the primary cooling circuit 1 is first active flow drive 33.

Usually, a central drive will serve several primary circuits. A rotating magnetic disk 7 is disposed on the same shaft with the primary turbine 5. The coolant 6 that puts the primary turbine 5 into rotation then reaches a return flow 11 after it has flowed through a contact surface 10. In this connection, it can remain open, within the framework of this exemplary embodiment, whether or not any additional primary cooling circuits are switched in series with the primary cooling circuit 1.

For the time being, it is also not of any further interest for the description of the exemplary embodiment whether the primary cooling circuit 1 is configured as a closed or an open system.

The secondary cooling circuit 2, which is configured with essentially the same construction, is thermally coupled with the primary cooling circuit 1 by way of the additional contact surface 12. The contact surfaces 10 and 12 can be configured elastically, in each instance, in order to guarantee the best possible coupling of the contact surfaces 10 and therefore the best possible heat transfer. Furthermore, a heat transfer paste can be introduced between the two contact surfaces 10 and 12, in a manner not shown further here, in order to further improve the heat transfer.

Furthermore, however, the secondary cooling circuit 2 is also inductively coupled with the flow drive of the primary cooling circuit 1, in contact-free manner, by way of another magnetic disk 13, which is disposed on the secondary cooling circuit 2. In the present example, the magnetic disks 7 and 13 are produced with the same construction. However, in order to achieve step-up or step-down of the drives, magnetic disks 7 and 13 that are structured in different manner, or different magnetization of the disks can certainly be used. A secondary turbine 14 is disposed on the same shaft with the additional magnetic disk 13, in the secondary cooling circuit 2, which turbine is driven in that the rotating magnetic disk 7 entrains the additional magnetic disk 13 of the secondary cooling circuit 2, and thereby drives the secondary turbine 14, which is disposed on the same shaft. The coolant 6' driven by the secondary turbine 14 reaches a heat exchange surface 16 of a cooling body 19, which is assigned to a processor 17 on the circuit board 18, with the interposition of an equalization container 15, which could, of course, additionally be disposed also in the primary cooling circuit 1. Of course, additional heat exchange surfaces could also be provided in the secondary cooling circuit 2, or the heat exchange surface 16 could be assigned to several processors 17. Finally, the coolant 6' circulating in the secondary cooling circuit 2 gets back to the secondary turbine 14, which follows in the flow direction, by way of an additional pressure reducer 20.

In the following, the function of the heat exchange system described above will once more be briefly explained:

An externally driven primary turbine 5 is disposed in the primary cooling circuit 1, which turbine drives a magnetic disk 7 that sits on the same shaft, and drives a secondary turbine 14 disposed in the secondary cooling circuit 2, by way of magnetic coupling with an additional magnetic disk 13 disposed in the secondary cooling circuit 2, so that in this way, the flow drive for the coolant 6' circulating in the secondary cooling circuit is guaranteed. The secondary cooling circuit 2 is therefore equipped, as a completely closed system, with a passive drive that is imparted solely by means of magnetic coupling. The secondary cooling circuit 2 can therefore be configured as a separate insertion unit or as an integral part of an insertion part for a high-performance processor unit, for example for a rack.

Above, a heat exchange system having a passive secondary cooling circuit is therefore implemented, which makes it possible to insert, retrofit, and if necessary exchange liquid-cooled cooling system in racks, without problems. The secondary cooling circuit 2, in particular, is free of maintenance, to a great extent, because it does not contain any active elements.

REFERENCE SYMBOL LIST 1 primary cooling circuit
2 secondary cooling circuit
3 inflow
4 pressure reducer
5 primary turbine
6, 6' coolant
7 magnetic disk
10 contact surface
11 return flow
12 additional contact surface
13 additional magnetic disk
14 secondary turbine
15 equalization container
16 heat exchange surface
17 processor
18 conductor plate
19 cooling body
20 additional pressure reducer

The invention claimed is:

1. A heat exchange system for an electronic device having high-performance processors or a high processor density, said heat exchange system comprising:
(a) at least one primary cooling circuit comprising a first liquid coolant, a first active flow drive, a passive flow drive, and a first contact surface;
(b) at least one secondary cooling circuit comprising a second liquid coolant, a second active flow drive, and a second contact surface; and
(c) at least one processor unit assigned to said at least one secondary cooling circuit;
wherein said at least one primary cooling circuit and said at least one secondary cooling circuit are thermally coupled so that heat absorbed by the at least one secondary cooling circuit is transferred by heat exchange to the at least one primary cooling circuit by way of the first contact surface and the second contact surface and is carried away or cooled off via the at least one primary cooling circuit;
wherein the first liquid coolant of the at least one primary cooling circuit is driven via the first active flow drive in the at least one primary cooling circuit;
wherein the passive flow drive is driven by motion of the first liquid coolant in the at least one primary cooling circuit;
wherein the passive flow drive is coupled inductively or magnetically with the second active flow drive of the at least one secondary cooling circuit to transmit rotation magnetically or inductively to the second active flow drive, the second active flow drive driving the second liquid coolant in the at least one secondary cooling circuit;
wherein the first and second liquid coolants can be differentiated and are separate from one another in terms of flow technology in that the first liquid coolant of the at least one primary cooling circuit is kept apart from the second liquid coolant of the at least one secondary cooling circuit; and
wherein the at least one secondary cooling circuit is configured as a separate insertion element, or as an integral part of an insert, that is provided with said at least one processor unit.

2. The heat exchange system according to claim 1, wherein the at least one secondary cooling circuit comprises a closed system without its own active flow drive.

3. The heat exchange system according to claim 1, wherein the passive flow drive of the at least one primary cooling circuit comprises a primary turbine having a connected coupling element, said connected coupling element ferromagnetically coupling in the flow energy required to drive the second liquid coolant in the at least one secondary circuit.

4. The heat exchange system according to claim 3, wherein the second active flow drive comprises a secondary turbine, the secondary turbine being disposed in the at least one secondary cooling circuit; and
wherein the connected coupling element comprises a first magnet mechanically driven by the primary turbine, said first magnet entraining a second magnet disposed in the at least one secondary cooling circuit, wherein the second magnet drives the secondary turbine to drive the second liquid coolant to be transported in the secondary cooling circuit.

5. The heat exchange system according to claim 4, wherein at least one pressure regulator or at least one pressure reducer is disposed in at least one of the at least one primary cooling circuit and the at least one secondary cooling circuit, ahead of the primary or secondary turbine, respectively.

6. The heat exchange system according to claim 4, wherein at least one speed of rotation regulator or speed of rotation reducer is assigned to at least one of the primary turbine and the secondary turbine.

7. The heat exchange system according to claim 1, wherein the passive flow drive comprises a primary turbine comprising a first rotating magnetic blade wheel, wherein the second active flow drive comprises a secondary turbine, said primary turbine driving said secondary turbine of the second active flow drive, the secondary turbine comprising a second magnetic blade wheel in the at least one secondary cooling circuit.

8. The heat exchange system according to claim 1, wherein at least one of the first and second contact surfaces is elastic.

9. The heat exchange system according to claim 8, wherein at least one of the contact surfaces comprises a die-cast aluminum part.

10. The heat exchange system according to claim 8, wherein the heat transfer in the region of the first and second contact surfaces is improved by a heat conducting paste interposed between the first and second contact surfaces.

11. The heat exchange system according to claim 1, wherein an equalization container is disposed in at least one of the primary cooling circuit and the secondary cooling circuit.

12. The heat exchange system according to claim 1, wherein at least one cooling body is assigned to the at least one processor unit, wherein for this purpose, the at least one cooling body is provided with bores through which the second liquid coolant of the at least one secondary circuit flows.

13. The heat exchange system according to claim 12, wherein the at least one cooling body is provided with a thermally conductive heat exchange surface on a side facing the at least one processor unit, said side being provided with some larger bores, and wherein the at least one cooling body is provided with a plurality of bores having a smaller diameter on the surface facing away from the heat exchange surface.

14. The heat exchange system according to claim 12, wherein the at least one cooling body comprises sintered copper.

* * * * *